United States Patent [19]

Igel et al.

[11] Patent Number: 5,933,715
[45] Date of Patent: Aug. 3, 1999

[54] PROCESS FOR MANUFACTURING DISCRETE ELECTRONIC DEVICES

[75] Inventors: Gunter Igel, Teningen; Ruediger Joachim Stroh, Freiburg, both of Germany

[73] Assignee: Micronas Intermetall GmbH, Freiburg, Germany

[21] Appl. No.: 08/812,293

[22] Filed: Mar. 7, 1997

[30] Foreign Application Priority Data

Mar. 9, 1996 [DE] Germany .............................. 196 09 229

[51] Int. Cl.$^6$ ...................... H01L 21/331; H01L 21/8222; H01L 21/44; H01L 21/311
[52] U.S. Cl. ........................... 438/149; 438/311; 438/348; 438/612; 438/613; 438/701; 438/978
[58] Field of Search ................................ 438/21, 311, 348, 438/149, 612, 613, 701, 978

[56] References Cited

U.S. PATENT DOCUMENTS 5,561,073 10/1996 Jerome et al. .
5,591,675 1/1997 Kim et al. .

FOREIGN PATENT DOCUMENTS

| 0010596 | 5/1980 | European Pat. Off. . |
| 1387418 | 3/1975 | United Kingdom . |
| 2125621 | 3/1984 | United Kingdom . |

OTHER PUBLICATIONS

ANAD, "X–Band High–Burnout Silicon–Schottky Mixer Diodes" IEEE Transactions on Components, Hybrids, and Manufacturing Technology, vol. CHMT–1., No. 4, Dec. 1978.

Patent Abstract of Japan, vol. 018, No. 270 (E–1552), May 23, 1994 –& JP 06 0452664 (Fujitsu Ltd), Feb. 18, 1994.

Copy of European Search Report for 97102193.6, dated Mar. 30, 1998.

Menz, et al., Mikrosystemtechnil Fur Ingenieure, VCH–Verlagsgesellschaft, pp. 171–184, 1993. (w/English synopsis).

G. Kaminsky, Micromachining of Silicon Mechanical Structures, J. Vac. Sci. Technol., B, vol. 3, No. 4, pp. 1015–1024, Jul./Aug. 1985.

German Examination Report dated Dec. 9, 1996.

*Primary Examiner*—John F. Niebling
*Assistant Examiner*—Josetta Jones
*Attorney, Agent, or Firm*—Arthur L. Plevy

[57] ABSTRACT

A process for manufacturing discrete electronic devices with active structures in an SOI (silicon-on-insulator) substrate which is thickened by an epitaxial layer and whose surface has a <100> orientation, said process comprising the steps of: anisotropically etching the first silicon layer to form a moat having a diameter tapering in the direction of the insulator layer, said moat extending to the insulator layer; forming an insulating layer on the sidewalls of the moat; removing a portion of the insulator layer adjoining the moat to expose a portion of the second silicon layer, which is separated from the first silicon layer by the insulator layer; forming the active structure in the second silicon layer below the portion of the insulator layer which was removed; and depositing a contact layer on the insulating layer and the active element for making contact to the active structure.

22 Claims, 2 Drawing Sheets

PROCESS FOR MANUFACTURING DISCRETE ELECTRONIC DEVICES

RELATED APPLICATIONS

The Assignee herein, Deutsche ITT Industries GmbH, is the record owner of U.S. patent application Ser. No. 08/784003 entitled PROCESS FOR FORMING ADJACENT MOATS OR HOLES, filed on Jan. 15, 1997.

1. Field of the Invention

The present invention relates to a process for manufacturing discrete electronic devices. More particularly, the present invention is relates to a process for manufacturing active structures in a silicon-on-insulator substrate including a first silicon layer, a second silicon layer, and an insulator layer disposed between the first and second silicon layers, the first silicon layer being thickened by an epitaxial layer.

2. Background of the Invention

A wide range of applications for discrete electronic devices is found in semiconductor technology. Using well-known semiconductor processes, active structures are formed on semiconductor wafers, particularly silicon wafers. The electronic devices thus, formed are separated from the wafer, and electrical connections are made to them. Such discrete electronic devices are, for example, diodes, particularly pn diodes and Schottky diodes, whose active structures are pn junctions and metal-semiconductor junctions, respectively, or power devices, which may have several active structures. The requirements placed on the high-frequency characteristics of such electronic devices are increasing. Therefore, the active structures should be as small as possible. This, however, involves a considerable amount of technical complexity. The photolithographic processes required to form such small active structures become highly complex, so that the manufacturing process and the electronic devices become expensive.

Accordingly, a process for manufacturing discrete electronic devices is needed which enables small active structures to be produced at low cost.

SUMMARY

The invention is directed to a process for manufacturing discrete electronic devices with active structures in an SOI (silicon-on-insulator) substrate which is thickened by an epitaxial layer and whose surface has a <100> orientation, said process comprising the steps of: anisotropically etching the first silicon layer to form a moat having a diameter tapering in the direction of the insulator layers, said moat extending to the insulator layer; forming an insulating layer on the sidewalls of the moat; removing a portion of the insulator layer adjoining the moat to expose a portion of the second silicon layer, which is separated from the first silicon layer by the insulator layer; forming the active structure in the second silicon layer below the portion of the insulator layer which was removed; and depositing a contact layer on the insulating layer and the active element for making contact to the active structure.

In one embodiment of the invention, the second silicon layer comprises two layers, one of the two layers adjoining the insulator layer and having a lower doping level than the other one of the two layers.

In another embodiment of the invention, the step of forming an active element comprises forming a doped region in the second silicon layer having a conductivity type which is opposite to that of the second silicon layer.

In still another embodiment of the invention, the step of forming an active element comprises the step of depositing a metal layer on the exposed portion of the second silicon layer.

In a further embodiment of the invention, a plurality of moats with active elements are formed in the substrate.

BRIEF DESCRIPTION OF THE DRAWINGS

The invention will now be explained in more detail with reference to the accompanying drawings, in which.

DETAILED DESCRIPTION OF THE INVENTION

Figure 1A:
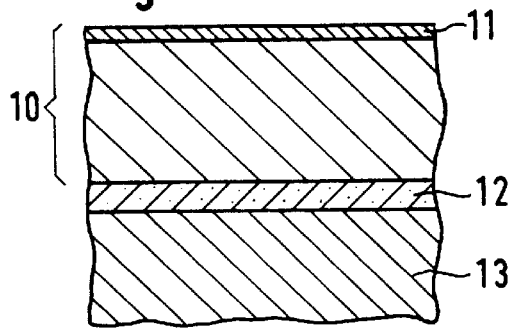
FIGS. 1a to 1f show a diode with a pn junction produced by the process according to the invention.

FIG. 1a shows an SOI substrate with a first silicon layer 10, an insulator layer 12, and a second silicon layer 13. The first silicon layer 10 has been thickened by an epitaxial layer 11. Through the epitaxial layer 11, the desired thickness of the first silicon layer 10 is achieved. The surface of the first silicon layer has a <100> orientation.

Figure 1D:
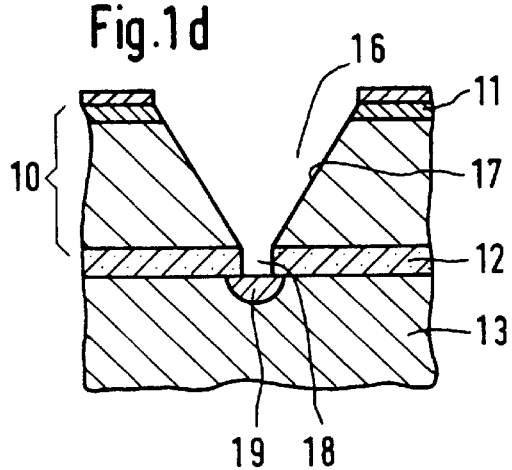
Figure 1B:
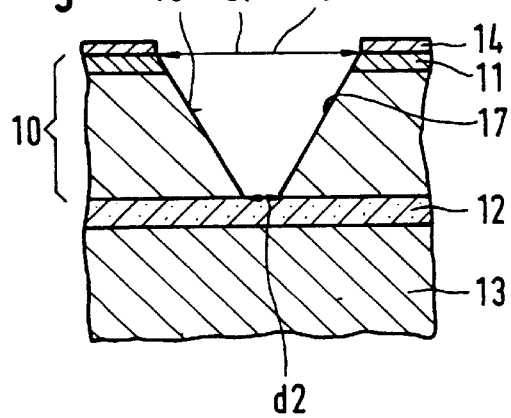

In FIG. 1b, a masking layer 14 with an opening 15 of a predetermined width or predetermined diameter d1 has been deposited on the first silicon layer 10. In the area of the opening 15, a truncated-cone-shaped moat or hole 16 having a sidewall 17 with a diameter tapering in the direction of the insulator layer 12 has been etched in the first silicon layer 10. The inclination of the moat's sidewall 17 is determined by the orientation of the first silicon layer 10. The ratio of the diameter d1 of the moat's upper opening to the diameter d2 of the moat's lower opening is thus determined by the thickness of the first silicon layer 10.

Figure 1E:
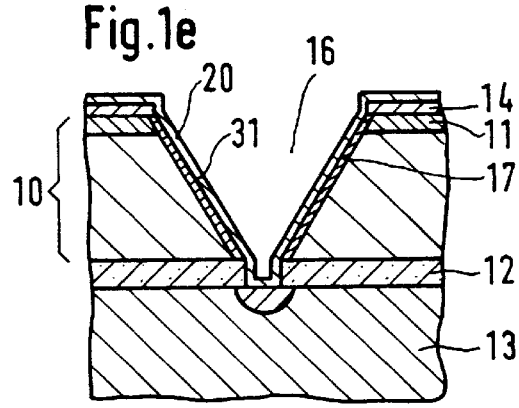
Figure 1C:
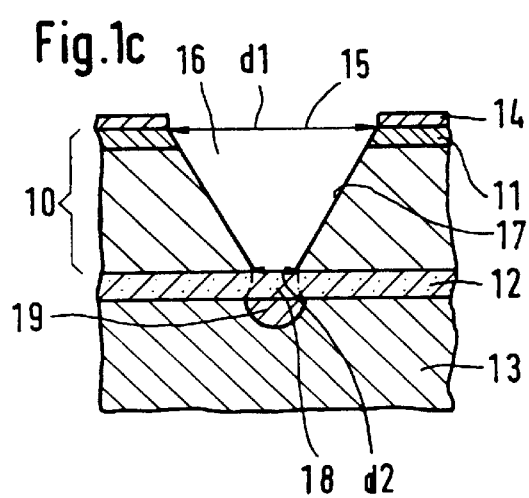

In FIG. 1c, a doped region 19 has been formed in the second silicon layer 13 below a region 18 of the insulator layer 12 adjoining the moat 16. Doping was carried out through the insulator layer 12 wherein the moat 16 was used for masking purposes. The doped region 19 is approximately the size of the lower diameter d2. This requires a photolithographic technique whose spatial resolution must be just sufficient to form an opening with the upper diameter d1 of the moat 16. The conductivity type of the doped region 19 is opposite to that of the second silicon layer 13, so that a pn junction, and thus a diode, is produced.

In FIG. 1d, the region 18 adjoining the moat 16 has been removed from the insulator layer 12, by etching, preferably anisotropic etching. It is also possible to interchange the order of the steps performed in FIGS. 1c to 1d, so that first the region 18 is removed from the insulator layer 12 and then the doped region 19 is formed.

In FIG. 1e, the sidewall 17 of the moat 16, the sidewall created by the removal of the region 18 from the insulator layer 12, and the doped region 19 have been covered by a contact layer 20, which is generally made of metal. Prior to the deposition of the contact layer 20 it is necessary to form an insulating layer 31 on at least on the sidewall 17 of the moat 16. In the embodiment shown, the first silicon layer 10 has been completely oxidized for this purpose. This step must take place after the formation of the electronic device of FIG. 1d at the latest. The oxidation may also take place already after the formation of the moat 16, shown in FIG. 1b. In oxidizing the first silicon layer 10, use is made of the fact that silicon oxidizes much faster than the material of the insulator layer 12, which is preferably silicon nitride. This is because silicon nitride sufficiently differs from the silicon in various properties and thus, when the insulator layer 12 is made from silicon nitride, such a layer inhibits the oxidation, i.e., the silicon-nitride layer has a passivating effect for the oxidation. Accordingly, oxidation takes place only on the first silicon layer 10. This has the advantage that no additional insulating layer need be deposited. The oxidation of the first silicon layer 10 ensures that parasitic capacitances between the first silicon layer 10 and the second silicon layer 13 are greatly reduced since, electric conduction between the second silicon layer 13, in which the active structure is formed, and the first silicon layer 10 is completely prevented. Such parasitic capacitances prevent fast switching of the active structure.

Figure 1F:
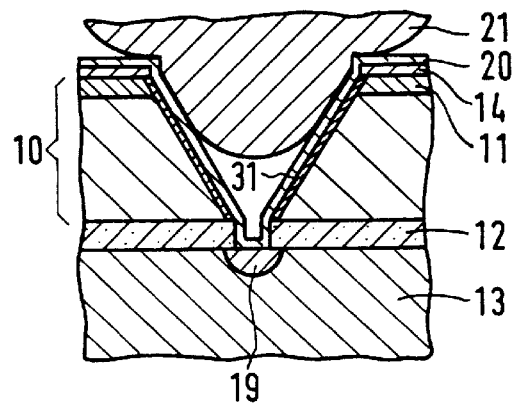

FIG. 1f illustrates how the contact layer 20 is connected to a lead wire 21. The connection may be made by bonding. As can be seen in FIG. 1f, the wire 21 rests on the contact layer 20 only at the sidewalls 17 of the moat 16, because its shape differs from that of the moat 16. Nevertheless, reliable contact is made to the doped region 19 through the contact layer 20. However, since the wire 21 does not rest directly on the doped region 19, the electronic device will not be impaired in its operation or mechanically destroyed by the bond pressure or by the pressure of an enclosure on the bond contact. Contact to the pn junction is made in the conventional manner through the substrate, formed here by the second silicon layer 13.

As should now be apparent, the process of the present invention has the advantage that the shape of the moat 16 in the first silicon layer 10 allows the active structure 19 formed in the second layer 13 to be smaller than the size achievable with the resolution capability of the photolithographic process used, since the photolithographic process is only required to form the mask 14 for the opening 15 of the moat 16 at the surface of the first silicon layer 10. In other words, the masking is provided on the first silicon layer 10, while the active element 19 is formed in the second silicon layer 13. The difference between the resolution of the photolithographic technique required and the size of the active structure that can still be formed by the photolithographic technique is determined by the ratio of the diameters at the opposite ends of the moat 16. This ratio can be varied by the thickness of the first silicon layer 10, i.e., particularly by the thickness of the epitaxial layer 11 by which the first silicon layer 10 is thickened. Thus, a small active structure can be formed by a photolithographic process which is much less complex than the process commonly required to produce this structure.

It should be understood that the order of the process steps depends on specific manufacturing conditions. The steps may be performed in the above order, but the order may be also be changed.

Figure 2:
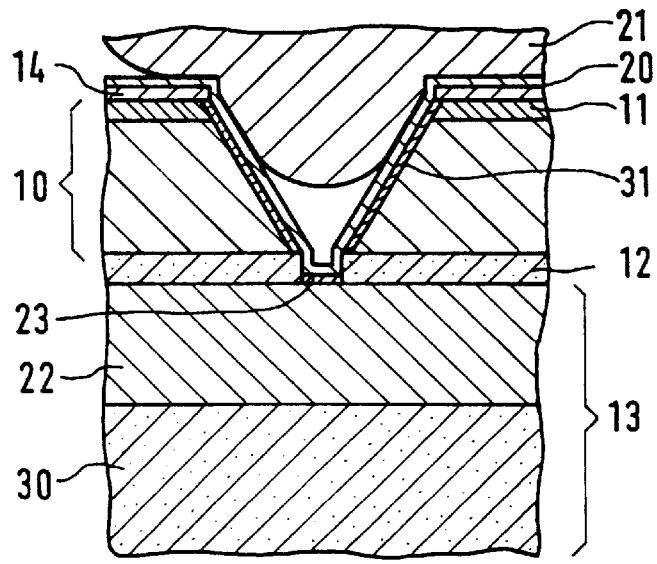
FIG. 2 shows a Schottky diode produced by the process according to the invention.

FIG. 2 shows a Schottky diode which was made by the process according to the invention. Like in FIG. 1a, the process starts with an SOI substrate which has a first silicon layer 10, an insulator layer 12, and a second silicon layer 13. The first silicon layer 10, like in the embodiment of FIG. 1a, is provided with a epitaxial layer 11, whereby a predetermined thickness of the first silicon layer 10 is achieved. In this embodiment, however, the second silicon layer 13 comprises two layers 22, 30, of which the layer 22 adjoining the insulator layer 12 has a lower doping level than the other layer 30. The layer 22 adjoining the insulator layer 12 may be an epitaxial layer. Through the lower doping level of the layer 22, specific parameters of the electronic devices can be adjusted which would not be attainable with the substrate. This includes in particular the breakdown voltage and the capacitance. The other layer 30 simultaneously ensures good electric conductivity. More specifically, the layer 30 comprises a substrate and the layer 22 comprises an epitaxial layer, with the epitaxial layer 22 having a lower doping level than the substrate 30. Since the second silicon layer 13 consists of two differently doped layers, a Schottky diode is produced. The moat 16, the region 18 removed from the insulator layer 12, the contact layer 20, and the connection 21 are formed analogously to the process explained with reference to FIGS. 1a–1f. Unlike in FIGS. 1a–1f, instead of forming the doped region 19, a metal layer 23 is deposited on the epitaxial layer 22 of the second silicon layer 13. In this embodiment it is, of course, necessary to remove the region 18 in the insulator layer 12 before depositing the metal layer 23. For the other process steps, reference is made to the embodiment of FIGS. 1a–1f.

Figure 3:
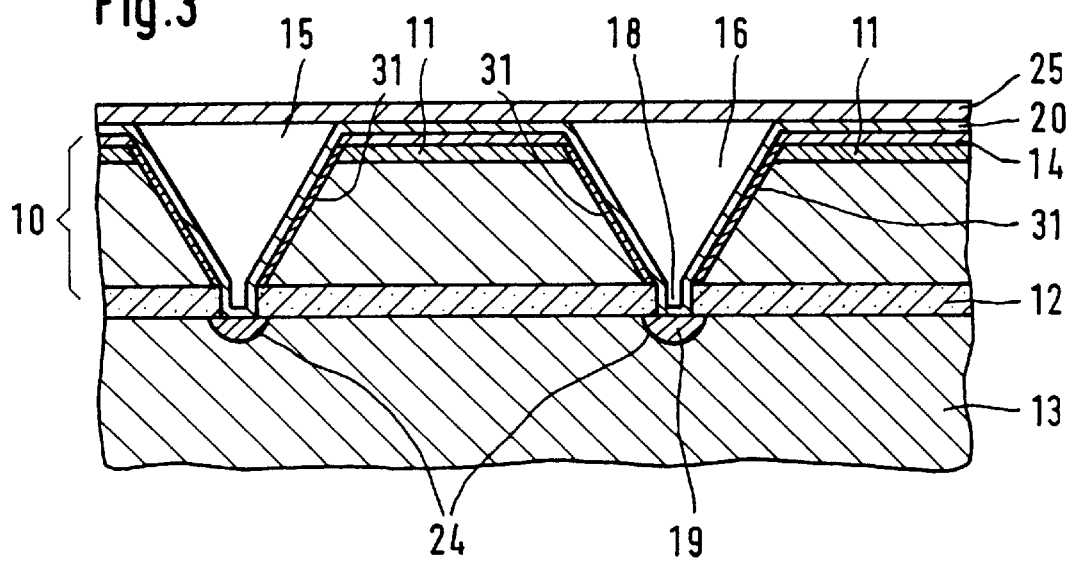
FIG. 3 shows part of a power diode produced by the process according to the invention.

FIG. 3 shows an embodiment where several moats with active structures are formed in a SOI substrate. This is advantageous for all devices in which several active structures are to be formed with spaces between them. Examples are power devices in which the current flow through the substrate is divided by use of several spatially separated, electrically interconnected structures. In this manner, better heat distribution can be achieved. A further application of semiconductors with several spatially separated active structures are DMOS transistors, for example. In the embodiment of FIG. 3, part of a power pn diode is depicted. Two pn junctions 24 are shown, and further pn junctions may be present in both directions. Up to the stage shown in FIG. 1e, these pn junctions are produced by the process described with reference to FIGS. 1a–1e. Several pn junctions are produced side by side. The distance between the pn junctions 24 may be determined beforehand. The minimum distance is determined by the resolution of the photolithographic process by which masking is provided for forming the moats 16. Above this minimum distance, the distance between the pn junctions 24 can be varied arbitrarily. To make contact to the contact layer 13, a metal plate 25 is put on which contacts the different pn junctions from the above. The second contact is made in the conventional manner through the substrate, formed here by the second silicon layer 13.

It should be understood that the embodiments described herein are merely exemplary and that a person skilled in the art may make many variations and modifications to the embodiments utilizing functionally equivalent elements to those described herein. Any and all such variations or modifications as well as others which may become apparent to those skilled in the art, are intended to be included within the scope of the invention as defined by the appended claims.

What is claimed is:

1. A process for manufacturing discrete electronic devices with active structures in a silicon-on-insulator substrate including a first silicon layer having a surface with a <100> orientation, a second silicon layer, and an insulator layer disposed between the first and second silicon layers, the first silicon layer being thickened by an epitaxial layer, the process comprising the steps of:

anisotropically etching the first silicon layer to form a moat having a diameter tapering in the direction of the insulator layer, the moat extending to the insulator layer;

forming a second insulating layer on a sidewall of the moat;

removing a portion of the insulator layer adjoining the moat to expose a portion of the second silicon layer, which is separated from the first silicon layer by the insulator layer;

forming an active element in the second silicon layer below the portion of the insulator layer which was removed; and depositing a contact layer on the second insulating layer and the active element for making contact thereto.

2. The process according to claim 1, wherein the insulator layer is a silicon-nitride layer.

3. The process according to claim 1, wherein the step of forming the second insulating layer on the sidewall of the moat comprises the step of oxidizing the first silicon layer.

4. The process according to claim 1, further comprising the step of completely oxidizing the first silicon layer.

5. The process according to claim 1, wherein the second silicon layer comprises two layers, one of the two layers adjoining the insulator layer and having a lower doping level than the other one of the two layers.

6. The process according to claim 1, wherein the step of forming an active element comprises forming a doped region in the second silicon layer having a conductivity type which is opposite to that of the second silicon layer.

7. The process according to claim 1, wherein the step of forming an active element comprises the step of depositing a metal layer on the exposed portion of the second silicon layer.

8. The process according to claim 1, wherein a plurality of moats with active elements are formed in the substrate.

9. A process for manufacturing an active element in a substrate having a first silicon layer, a second silicon layer, and an insulator layer disposed between the first and second silicon layers, the process comprising the steps of:

etching a moat in the first silicon layer, the moat extending to the insulator layer and having a sidewall with a diameter which tapers in the direction of the insulator layer;

forming a second insulating layer on the sidewall of the moat;

removing a portion of the insulator layer adjoining the moat to expose an underlying portion of the second silicon layer; and forming an active element using the underlying portion of the second silicon layer.

10. The process according to claim 9, further comprising the step of depositing a contact layer on the second insulating layer and the active element for making contact thereto.

11. The process according to claim 9, wherein the insulator layer comprises a silicon-nitride layer.

12. The process according to claim 9, wherein the step of forming the second insulating layer on the sidewalls of the moat comprises the step of oxidizing the first silicon layer.

13. The process according to claim 9, further comprising the step of completely oxidizing the first silicon layer.

14. The process according to claim 9, wherein the second silicon layer comprises two layers, one of the two layers adjoining the insulator layer and having a lower doping level than the other one of the two layers.

15. The process according to claim 9, wherein the step of forming an active element comprises the step of doping the exposed portion of the second silicon layer so that the exposed portion has a conductivity type which is opposite to of the second silicon layer.

16. The process according to claim 9, wherein the step of forming an active element comprises the step of depositing a metal layer on the exposed portion of the second silicon layer.

17. A process for manufacturing a plurality of active elements in a substrate having a first silicon layer, a second silicon layer, and an insulator layer disposed between the first and second silicon layers, the process comprising the steps of:

etching a plurality of moats in the first silicon layer, each of the moats extending to the insulator layer and having a sidewall with a diameter which tapers in the direction of the insulator layer;

forming a second insulating layer on the sidewall of each of the moats;

removing a portion of the insulator layer adjoining each of the moats to expose underlying portions of the second silicon layer; and forming a plurality of active elements using each of the underlying portions of the second silicon layer.

18. The process according to claim 17, further comprising the step of depositing a contact layer on each of the second insulating layers and the active elements for making contact thereto.

19. The process according to claim 18, further comprising placing a metal plate on each of the contact layers.

20. The process according to claim 17, wherein the second silicon layer comprises two layers, one of the two layers adjoining the insulator layer and having a lower doping level than the other one of the two layers.

21. The process according to claim 17, wherein the step of forming a plurality of active elements comprises the step of doping the exposed portions of the second silicon layer so that the exposed portions have a conductivity type which is opposite to of the second silicon layer.

22. The process according to claim 17, wherein the step of forming a plurality of active elements comprises the step of depositing a metal layer on each of the exposed portions of the second silicon layer.

* * * * *